US008402418B2

(12) United States Patent
Berry et al.

(10) Patent No.: US 8,402,418 B2
(45) Date of Patent: Mar. 19, 2013

(54) SYSTEM AND PROCESS FOR AUTOMATIC CLOCK ROUTING IN AN APPLICATION SPECIFIC INTEGRATED CIRCUIT

(75) Inventors: Clay Berry, Garland, TX (US); Timothy J. McDonald, Austin, TX (US)

(73) Assignee: NVIDIA Corporation, Santa Clara, CA (US)

( * ) Notice: Subject to any disclaimer, the term of this patent is extended or adjusted under 35 U.S.C. 154(b) by 256 days.

(21) Appl. No.: 12/650,968

(22) Filed: Dec. 31, 2009

(65) Prior Publication Data
US 2011/0161901 A1 Jun. 30, 2011

(51) Int. Cl.
*G06F 17/50* (2006.01)
(52) U.S. Cl. ........ 716/131; 716/118; 716/119; 716/121; 716/124; 716/125; 716/126; 716/128
(58) Field of Classification Search .................. 716/131, 716/118–119, 121–126, 128–129, 138
See application file for complete search history.

(56) References Cited

U.S. PATENT DOCUMENTS

| 5,691,662 | A  | * | 11/1997 | Soboleski et al. | 327/292 |
|---|---|---|---|---|---|
| 5,787,006 | A  |   | 7/1998  | Chevallier et al. | |
| 6,080,206 | A  | * | 6/2000  | Tadokoro et al. | 716/124 |
| 6,111,756 | A  |   | 8/2000  | Moresco | |
| 6,198,635 | B1 |   | 3/2001  | Shenoy et al. | |
| 6,397,375 | B1 | * | 5/2002  | Block et al. | 716/127 |
| 6,687,889 | B1 | * | 2/2004  | Secatch et al. | 716/113 |
| 6,898,770 | B2 |   | 5/2005  | Boluki et al. | |
| 6,983,443 | B2 | * | 1/2006  | Korzyniowski et al. | 716/113 |
| 7,080,341 | B2 | * | 7/2006  | Eisenstadt et al. | 326/81 |
| 7,107,200 | B1 | * | 9/2006  | Korobkov | 703/13 |
| 7,161,812 | B1 |   | 1/2007  | Thomas | |
| 7,281,232 | B1 |   | 10/2007 | Nicolino, Jr. et al. | |
| 7,308,667 | B2 | * | 12/2007 | Katagiri | 716/123 |
| 7,454,735 | B2 | * | 11/2008 | Arthanari et al. | 716/123 |
| 7,467,367 | B1 | * | 12/2008 | Li et al. | 716/103 |
| 7,774,732 | B2 | * | 8/2010  | KleinOsowski et al. | 716/119 |
| 2002/0188920 | A1 |   | 12/2002 | Lampaert et al. | |
| 2004/0078773 | A1 |   | 4/2004  | Sharma et al. | |
| 2005/0097497 | A1 | * | 5/2005  | Schlansker et al. | 716/14 |
| 2006/0031699 | A1 | * | 2/2006  | Arthanari et al. | 713/500 |
| 2006/0156266 | A1 | * | 7/2006  | Alpert et al. | 716/13 |
| 2006/0288323 | A1 | * | 12/2006 | Birch | 716/12 |
| 2007/0157144 | A1 | * | 7/2007  | Mai et al. | 716/10 |
| 2009/0271752 | A1 | * | 10/2009 | Alpert et al. | 716/9 |
| 2011/0055791 | A1 | * | 3/2011  | Gao | 716/131 |

* cited by examiner

*Primary Examiner* — Stacy Whitmore

(57) ABSTRACT

Embodiments of the claimed subject matter are directed to methods and a system that use a standardized grid of clock buffers to automatically route clocks according to a uniform clock grid throughout an ASIC of a non-uniform arrangement of non-uniformly sized logic partitions. According to one embodiment, clock sources and sinks are mapped to grid point locations and a novel grid routing process is performed to link them together. A clock routing macro is assigned to a corresponding partition and associated with the corresponding partition or logic unit according to a partition hierarchy. The underlying routing structure and resources of a clock routing macro are automatically renamed to correspond to the local partition in a script or schedule of programmed instructions, or a routing map. The position of blockages within a partition may also be detected and alternate routes for traversing the blockage may be preemptively determined as well.

14 Claims, 6 Drawing Sheets

SYSTEM AND PROCESS FOR AUTOMATIC CLOCK ROUTING IN AN APPLICATION SPECIFIC INTEGRATED CIRCUIT

BACKGROUND

Integrated circuits (IC) are miniaturized electronic circuits that are typically manufactured from a semiconductor material. Due to the reliability of integrated circuits and developments within the industry that allow ICs to be mass produced, the usage of integrated circuits has become ubiquitous in the manufacture of many commercial electronics equipment produced today and have contributed significantly to the proliferation and development of the electronics industry.

Application-specific integrated circuits (ASICs) are integrated circuits designed and customized for a particular use. Often, one or more ASICs are implemented on or as part of an electronic hardware chip. In a typical integrated circuit design, disparate and independent units (or "modules") of logic are clustered with units having similar function and/or purpose to form separate, specialized partitions within the chip. Many integrated circuits will use one or more clock signals in order to synchronize the modules of the circuit and to account for propagation delays across the chip. This clock signal may be generated by a clock source (such as a phase-locked loop), and directed and propagated through the partitions in a chip via clock routes between adjacent partitions.

In typical implementations, routes connecting partitions and clock sources may be pre-determined and implemented by routing macros among the adjacent partitions. Conventionally, these routing macros are embedded and intrinsic to the partitions, wherein a single partition may have multiple macros. For example, a common configuration comprises partitions with four or more macros, oriented according to compass directions (e.g., North, South, West and/or Center and East). For exceptionally large partitions, additional mid-partition macros may also be included. Global clock routing tools layout the clock sources based on a grid that is overlaid onto the chip. The overall clock layout grid may not be associated with the underlying partition, so the placement of the clock source may become problematic within the partition layout.

According to conventional IC design methodology, each clock signal may be programmed to take a particular route once the "floor plan" of the partitions is known (e.g., set by design). Because the sizes and shapes of partitions may vary according to the particular configurations of logic there is a tendency for the partitions to be shaped irregularly and/or asymmetrically due to ad hoc customization. As a consequence, programming the routing between partitions must be performed manually, and every route is independently specified for each step in the route. Naturally, this can be a very time consuming and effort-intensive procedure. As ICs become more complex (e.g., designed to include more partitions), the problem of supplying accurate and synchronized clocks to all the circuits becomes increasingly difficult.

Further complicating the matter, the inconsistency of partition sizes and shapes can add to the complexity of manually programming specific routes as well as resulting in severely inconsistent hop lengths, which, when combined with human error, increases the potential for sub-optimal clock routes or ineffective signal delivery. Moreover, chip designs may change between the initial floor planning stage and the completion of a final design within the design process. Frequently, the size and/or shape of one or more partitions may change dramatically, and, because the ability of a clock routing macro to propagate a signal is finite, significant alterations may result in transition violation issues as an originally adequate clock routing macro may no longer be sufficient to propagate a signal to the next destination in a route, thereby rendering the original clock routing macro layout obsolete and requiring significant reprogramming of the corresponding one or more clock routes. In some cases, the modification of the partitions may occur even after the macros have been embedded to the macro. In such instances, post design change orders may be required, which may contribute heavily to unnecessary delays and additional labor costs.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

Embodiments of the claimed subject matter are directed to methods and a system that use a standardized grid of clock buffers to automatically route clocks throughout an ASIC of various sizes and compositions. According to one embodiment, clock sources and sinks are mapped to grid point locations and then a novel grid routing process is performed to link them together. According to embodiments of the claimed invention, any shape of the grid may be accommodated using standard rectangular grid dimensions (e.g., 4×6, 5×5) and then identifying blockages where customized partitions, hard macros or highly congested areas of logic through which routes may be undesirable.

According to further embodiments, a method for grid routing is provided wherein blockages are opportunistically bypassed and detoured around, as required. Grid points are sized from several available buffer arrays based on the number of clock signals that are determined to pass through it. Clock signal paths from common start points are merged to reduce power, decrease clock skew, and minimize routing congestion. According to some embodiments, the grid of clock routing macros is defined at the register-transfer level (RTL) of the logic design phase. When the physical implementation is created, the grid points are overlaid on the chip physical layout. The clock routing macros at each grid point are pushed into the partition that covers that grid point.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
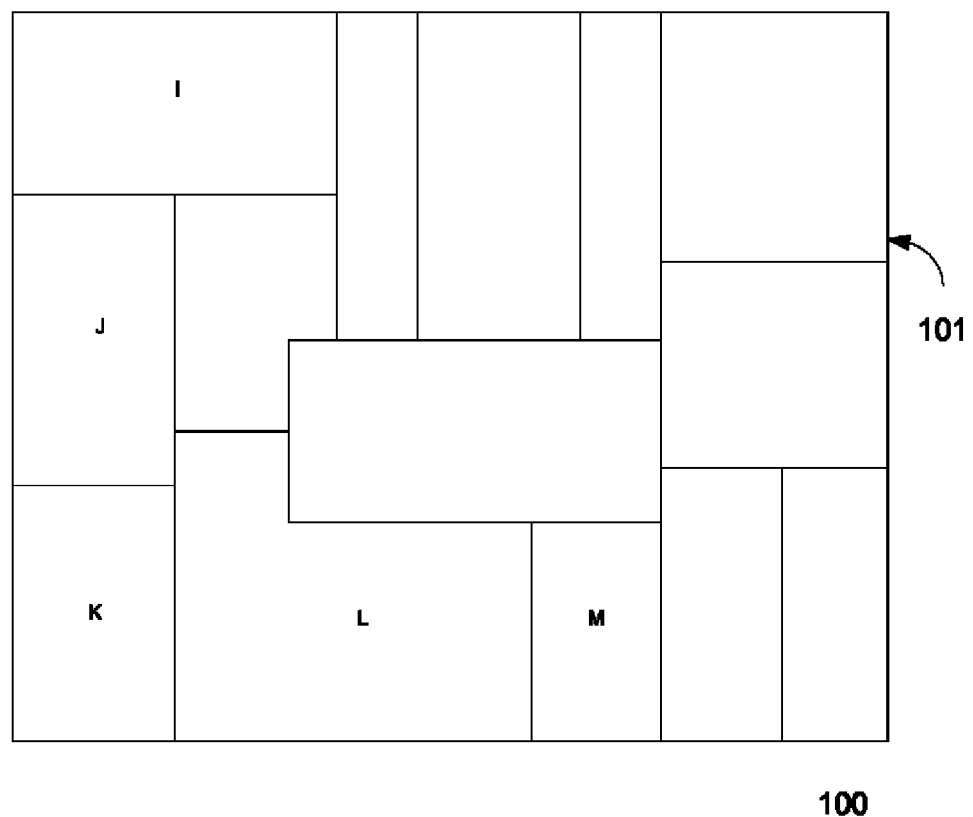
FIG. 1 depicts a block diagram of an exemplary floor plan of an ASIC, in accordance with various embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known processes, procedures, components, and circuits have not been described in detail as not to unnecessarily obscure aspects and features of the subject matter.

Portions of the detailed description that follow are presented and discussed in terms of a process. Although steps and sequencing thereof are disclosed in figures herein (e.g., FIGS. 5, 6) describing the operations of this process, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "traversing," "associating," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Accordingly, embodiments of the present invention provide methods and a system for automatically generating a path of inter-connected clock routing macros to perpetuate a clock signal to remote logic clusters in an integrated circuit chip. Embodiments of the present invention and their benefits are further described below Exemplary Chip Design Referring now to FIG. 1, a block diagram of an exemplary floor plan design 100 of an ASIC is depicted, in accordance with various embodiments of the present invention. In typical embodiments, the floor plan design 100 comprises a plurality of partitions, e.g., partitions I, J, K, L, M (additional partitions unmarked), disposed on a chip 101. These partitions comprise for example, partitions of an ASIC dedicated to perform specific and/or independent functions within the ASIC. As depicted in FIG. 1, the partitions may comprise non-uniform and/or asymmetric dimensions which may prevent a convenient arrangement. In some embodiments, individual partitions may be laid out using unique grid coordinates. In further embodiments, subsections of the partitions may be further delineated within individual clusters of logic.

Figure 2:
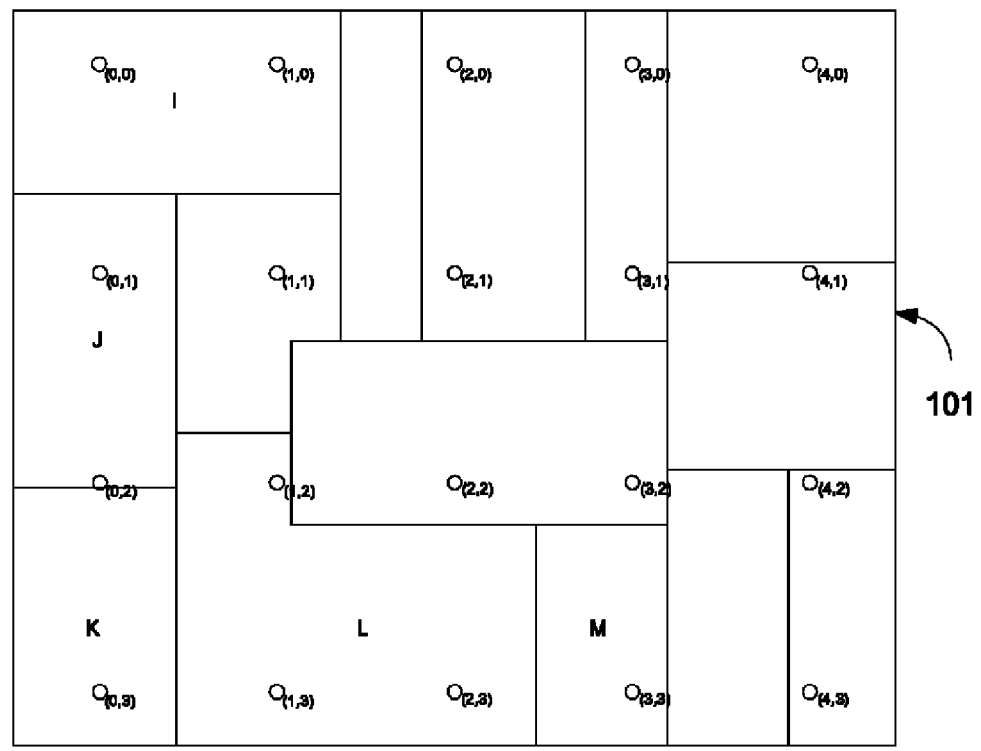
FIG. 2 depicts a block diagram of an exemplary floor plan of an ASIC with a plurality of grid points arranged according to a grid layout process, in accordance with various embodiments of the present invention.

Referring now to FIG. 2, a block diagram of an exemplary floor plan design 200 of an ASIC with a plurality of grid points arranged according to a grid layout process is depicted in accordance with various embodiments of the present invention. As presented, the floor plan design 200 comprises the plurality of partitions, e.g., partitions I, J, K, L, M (additional partitions unmarked), and chip 101 described above with respect to FIG. 1. In typical embodiments, one or more clock sources (not shown) are disposed in the various partitions within the chip. In further embodiments, the clock sources may be distributed according to a grid pattern. The clock sources generate clock signals to be distributed to both locally disposed and remote partitions and/or the specific clusters of logic within the partition. The signals are typically distributed by coupled clock routing macros arranged throughout the partitions. As depicted, floor plan design 200 also includes a plurality of clock routing macros, e.g., clock routing macros enumerated as (0,0), (1,0), (0,1) etc. . . .

In conventional configurations, each partition generally includes one or more clock routing macros intrinsic and exclusive to the partition. These clock routing macros commonly correspond roughly to the vertical and horizontal boundaries of the particular partition. Often, these clock routing macros are specified early in the design process and used to determine specific, programmed routes that a generated clock signal may take to distribute a clock signal to remote partitions and/or clusters of logic. Due to the possibility of non-uniform partitions however, such arrangement may lead to inefficient or ineffective signal routing paths due to non-uniform signal hops (e.g., the distance traveled between clock routing macros), ultimately requiring the process for path generation to be performed manually in the prior art.

According to embodiments of the present invention however, the clock routing macros are arranged according to a roughly regular and uniform spacing which approximates a grid. In typical embodiments, the clock routing macros are also not intrinsic to the local partition and may be utilized by partitions of sufficient proximity. Furthermore, by allocating the clock routing macros to approximate a grid, the signal hops will also become of uniform length and regularity. These beneficial effects result in a decreased overall complexity and enable a path generation process to be performed automatically. On occasion, spacing conforming to an exact grid distribution may not be possible for one or more clock routing macros, due to blockages, or noncompliant partition shapes. According to these embodiments, the positioning of the one or more clock routing macros may be adjusted to accommodate the blockages and/or partitions (e.g., such that each partition will have a clock routing macro pushed to it). In these embodiments, the macros are adjusted such that the adjusted position best approximates the structure and position of a grid.

In typical embodiments, the clock routing macros may be coupled to vertically and horizontally adjacent clock routing macros via wiring (e.g., copper wiring). In further embodiments, the dimensions of the grid may be determined as a function of the driver size for the clock routing macros. According to some embodiments, the clock routing macros comprising the points on the grid may be sized from several available buffer arrays based on the number of clock signals that are determined to pass through it. In further embodiments, the clock signal paths from common start points are merged together to reduce power, decrease clock skew, and minimize routing congestion.

Automatic Clock Routing

Figure 3:
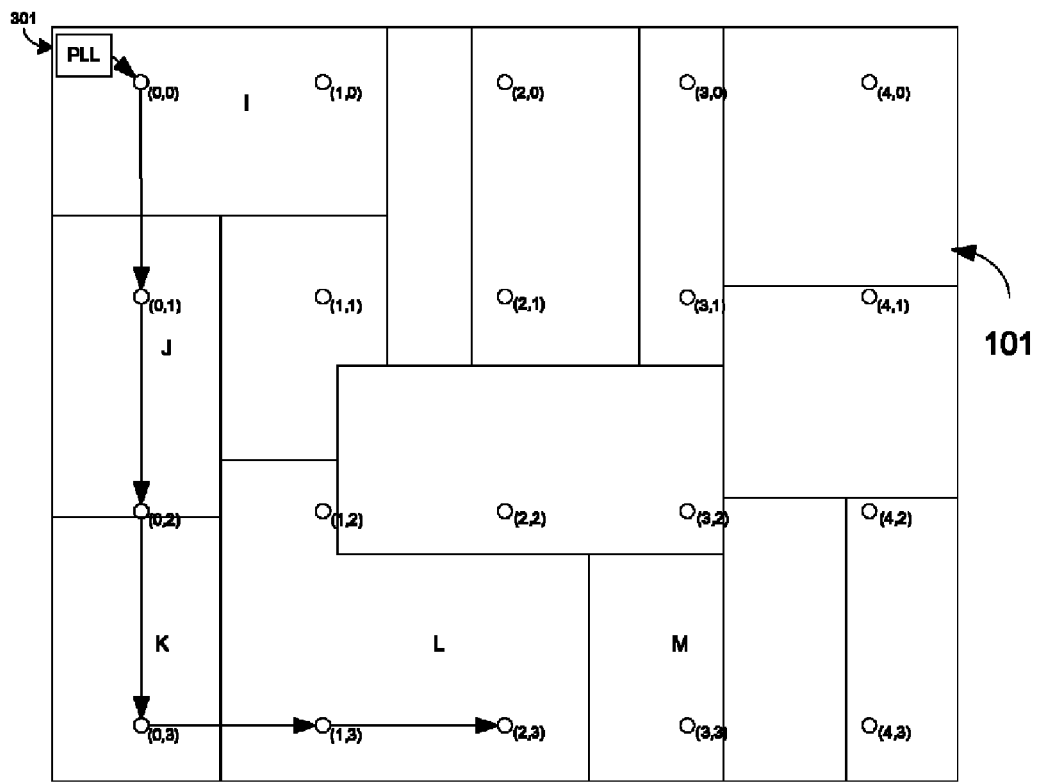
FIG. 3 depicts a block diagram of an exemplary clock route in a floor plan of an ASIC with a plurality of grid points arranged according to a grid layout process, in accordance with various embodiments of the present invention.

With reference now to FIG. 3, a block diagram of an exemplary clock route in a floor plan design 300 of an ASIC with a plurality of grid points arranged according to a grid layout process is depicted, in accordance with various embodiments of the present invention. As presented, the floor plan design 300 comprises the plurality of partitions, e.g., partitions I, J, K, L, M (additional partitions unmarked), and chip 101 described above with respect to FIG. 1, as well as the plurality of clock routing macros, e.g., clock routing macros enumerated as (0,0), (1,0), (0,1) etc. described above with respect to FIG. 2.

As depicted in FIG. 3, design 300 also includes a clock source (e.g., phase-locked loop 301) and a route (indicated by the directed line segments) between the clock routing macro most proximate to the clock source (e.g., the clock routing macro at (0, 0)) and a signal destination, e.g., clock routing macro at (2, 3). The route presents an exemplary path with which a clock signal generated by the clock source 301 may be delivered to a destination in a remote partition. According to embodiments of the present invention, the path traveled by the clock signal is generated automatically, without requiring conventional manual pre-programming. In further embodiments, the path traveled by the clock signal is the best (e.g., shortest) available path as determined by a process or design tool, such as maze router.

Figure 4:
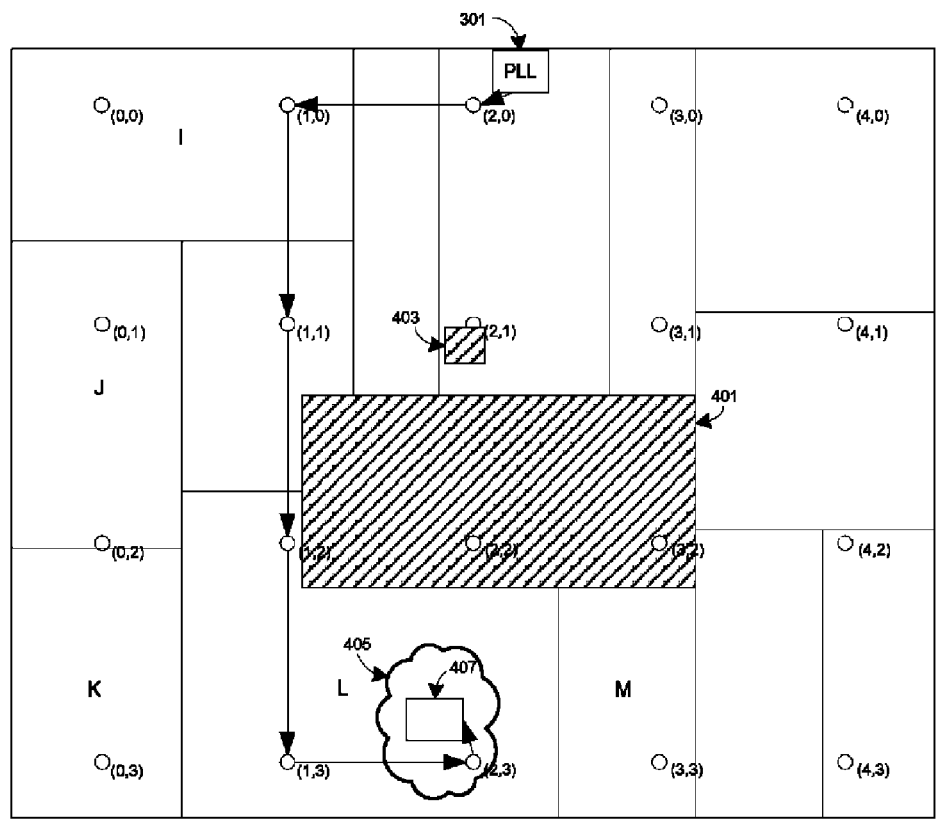
FIG. 4 depicts a block diagram of an exemplary clock route to avoid a hard macro in a floor plan of an ASIC with a plurality of grid points arranged according to a grid layout process, in accordance with various embodiments of the present invention.

FIG. 4 depicts a block diagram of a clock route which avoids a plurality of blockages in a floor plan design 400 of an exemplary ASIC with a plurality of grid points arranged according to a grid layout process, in accordance with various embodiments of the present invention. As presented in FIG. 4, the floor plan design 400 the chip, partitions, clock routing macros and clock source corresponding to various features referenced above with respect to FIGS. 1 to 3 are depicted. FIG. 4 also includes a plurality of blockages (e.g., blockages 401, 403), a cluster of logic 405, and a logic module 407.

According to some embodiments, blockages may be automatically avoided by a route generated by the process of automatic clock signal routing. Blockages may include, for example, sensitive areas of the chip not suitable for being under conductive wiring. These areas may include, but are not limited to, hard macros and areas of little or no silicon, for example. As presented, entire partitions (e.g., blocked partition 401) may be considered a blockage for the purposes of clock routing. Alternatively, a blockage may partially or completely comprise a clock routing macro (e.g., block age 405 obstructs clock routing macro at (2, 1)). According to such embodiments, a shortest available path that would otherwise travel across or through clock routing macros disposed on or within such blockages is not used. Rather, the shortest available path which avoids the blockages would be automatically generated. As depicted in FIG. 4, a path that circumvents the clock routing macros immediately obstructed by the plurality of blockages 401, 403 is provided. According to still further embodiments, the logic module 407 may comprise a specific assembly of logic 409 which itself is comprised in a logic cluster 405 of a partition (e.g., partition L).

Defining Macro Grid Layout

Figure 5:
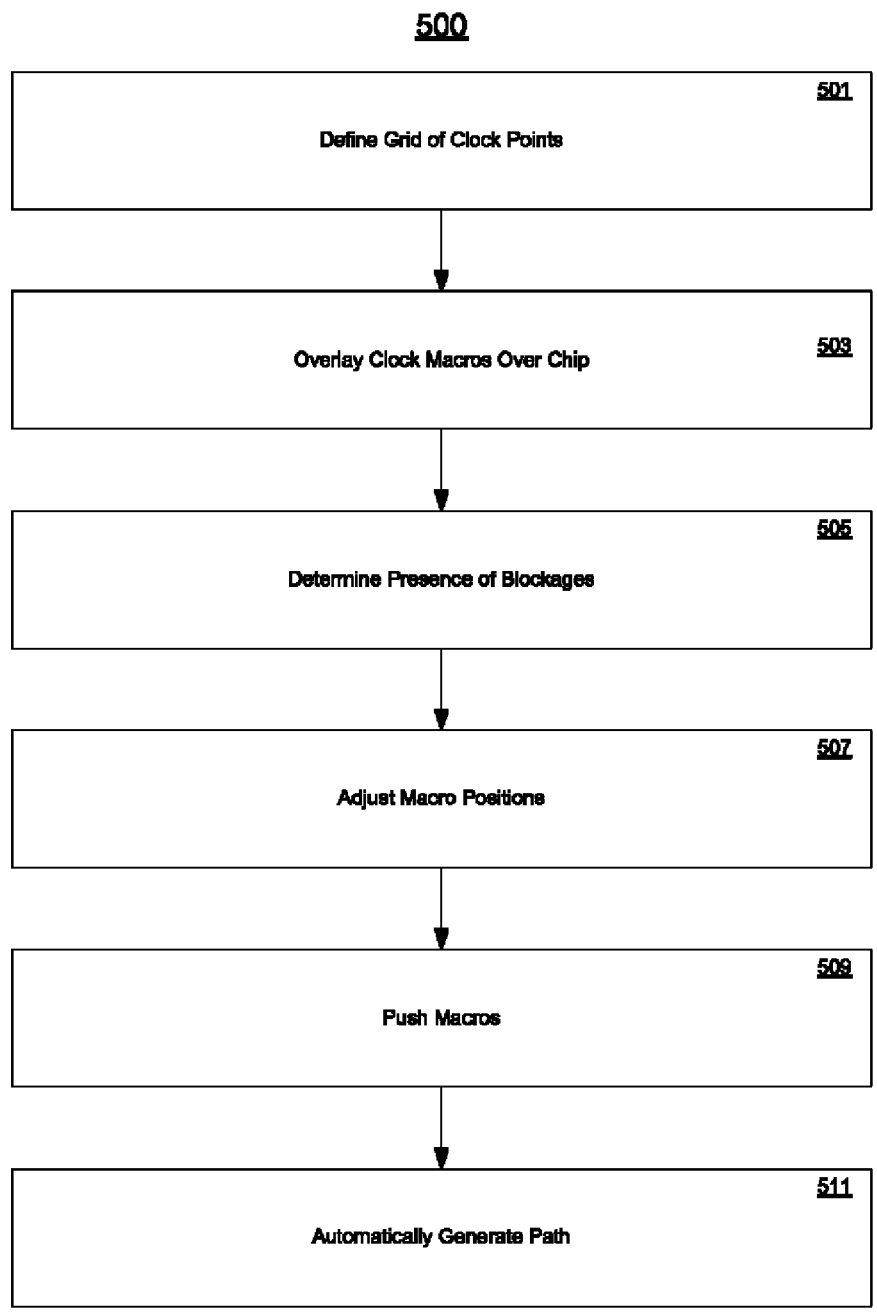
FIG. 5 depicts a flowchart of a process for defining a grid of clock routing macros in an ASIC, in accordance with various embodiments of the present invention.

With reference now to FIG. 5, a flowchart 500 of a process for defining a grid of clock routing macros in an ASIC is depicted, in accordance with various embodiments of the present invention. Steps 501-511 depict exemplary steps that comprise the process displayed in flowchart 500.

At step 501, a grid of clock routing points is defined for an ASIC chip comprising a plurality of partitions. In one embodiment, the grid of clock routing points is designed to correspond to the floor plan of the ASIC chip. Step 501 may comprise, for example, determining an appropriate spacing for each clock routing point in the grid. In typical embodiments, each clock routing point in the grid of clock routing points is spaced at roughly uniform distances from adjacent clock routing points, thereby creating a configuration that approximates a grid. In to some embodiments, step 501 is performed at the RTL phase of an ASIC design process, and may be performed before a floor plan is finalized. In some instances, if a modification to a design is detected, pre-programmed routes (described below) may be verified to ensure the route is accessible. According to further embodiments, the clock routing points comprising the grid of clock routing points are arranged according to a coordinate system. In still further embodiments, the clock routing points are identified according to the corresponding coordinate point in the system.

At step 503, the grid of clock routing points is overlaid over a design of an IC chip that corresponds to the floor plan of the ASIC chip referenced in step 501. According to some embodiments, the grid of clock routing points is overlaid over the design of an IC chip in an alternate layer in the design phase that allows a view of the positions of the clock routing points relative to the logic units in the design. At step 505, the presence of blockages obstructing the clock routing points in the grid of clock routing points. Blockages may include but are not limited to, hard macros or highly congested areas of logic through which routes may be undesirable, and other sensitive areas not suitable to host or be located proximate to infrastructure for clock signal routing.

At step 507, positioning of the plurality of clock routing points in the grid may be adjusted to accommodate particular partitions or to avoid blockages. For example, a position of a clock routing point may be adjusted to be disposed within a partition that would otherwise not encompass a clock routing point. According to typical embodiments, a clock routing point that is adjusted to accommodate a partition or avoid a blockage may be adjusted while maintaining the shape and structure of a uniform grid to the extent possible.

At step 509, a plurality of clock routing macros is pushed into the plurality of partitions of a design in an arrangement according to the grid of clock routing points overlaid on the ASIC design in step 503. According to some embodiments, pushing a clock routing macro into a partition includes assigning the clock routing macro to the corresponding partition and associating the clock routing macro to the corresponding partition or logic unit according to the partition hierarchy. In further embodiments, the underlying routing structure and resources (e.g., definitions) of a clock routing macro are automatically renamed to correspond to, and be identified with, the local partition in a script or schedule of programmed instructions, or a routing map. Thus, for example, the endpoints of the routing buffers comprising the clock routing macros may be renamed to correspond to the local partition and stored for future reference. Additionally, the identification of the clock source providing a clock signal to be distributed, the identification of any and all destinations for the clock signal, and the partition-based identifications of adjacent clock routing macros may all be renamed and recorded during the push at step 509. In still further embodiments, this script or routing map may be recorded and stored in a computer readable medium. In additional embodiments, the position of blockages within a partition may also be stored. In such embodiments, alternate routes for traversing the blockage may be preemptively determined and stored as well.

Once the grid of clock routing macros has been established and associated with proximate logic units, a path from a clock signal to a clock source disposed in the ASIC chip and a signal destination (e.g., a logic unit) remotely located in the ASIC chip may be generated automatically through a process or tool by referencing the script or routing map at step 511. In one embodiment, the process or tool receives an identification of the circuit corresponding to the clock source and/or the logic unit requesting a clock signal. Once the one or more identifications are received, the script or routing map containing the renamed associations for the individual clock routing macros is referenced for data corresponding to the clock macros comprising the individual steps in a route between the source and destination. and a path may be generated from this referenced material. The clock signal may be subsequently distributed according to the automatically generated path. In one embodiment, each step of a generated prospective path may be compared to other prospective path steps to optimize the path by providing the shortest available path.

According to further embodiments, each step of a generated prospective path is further verified to not include any blockages. If a blockage in a prospective path is determined, an alternate path is generated that is the shortest available path that avoids the blockage. In still further embodiments, once a path between a clock source and a clock signal destination has been generated (including modified paths that avoid blockages), the path may be automatically pre-programmed and stored in a routing map or schedule. Clock routing signals in an ASIC may thus be distributed according to the map or schedule.

By using this automated process of path generation, a reduction in manual placement and relatively fixed transition times for all clock hops in the chip are enabled. Another benefit is that the grid may be defined during the RTL phase and can be created before the floor plan is complete. Traditional mechanisms were often subject to higher jitter, routing perturbations, unnecessary routing detours and significant amounts of hand tuning time due to non-uniform clock hops and partition intrinsic clock routing macros.

Automated Path Generation

Figure 6:
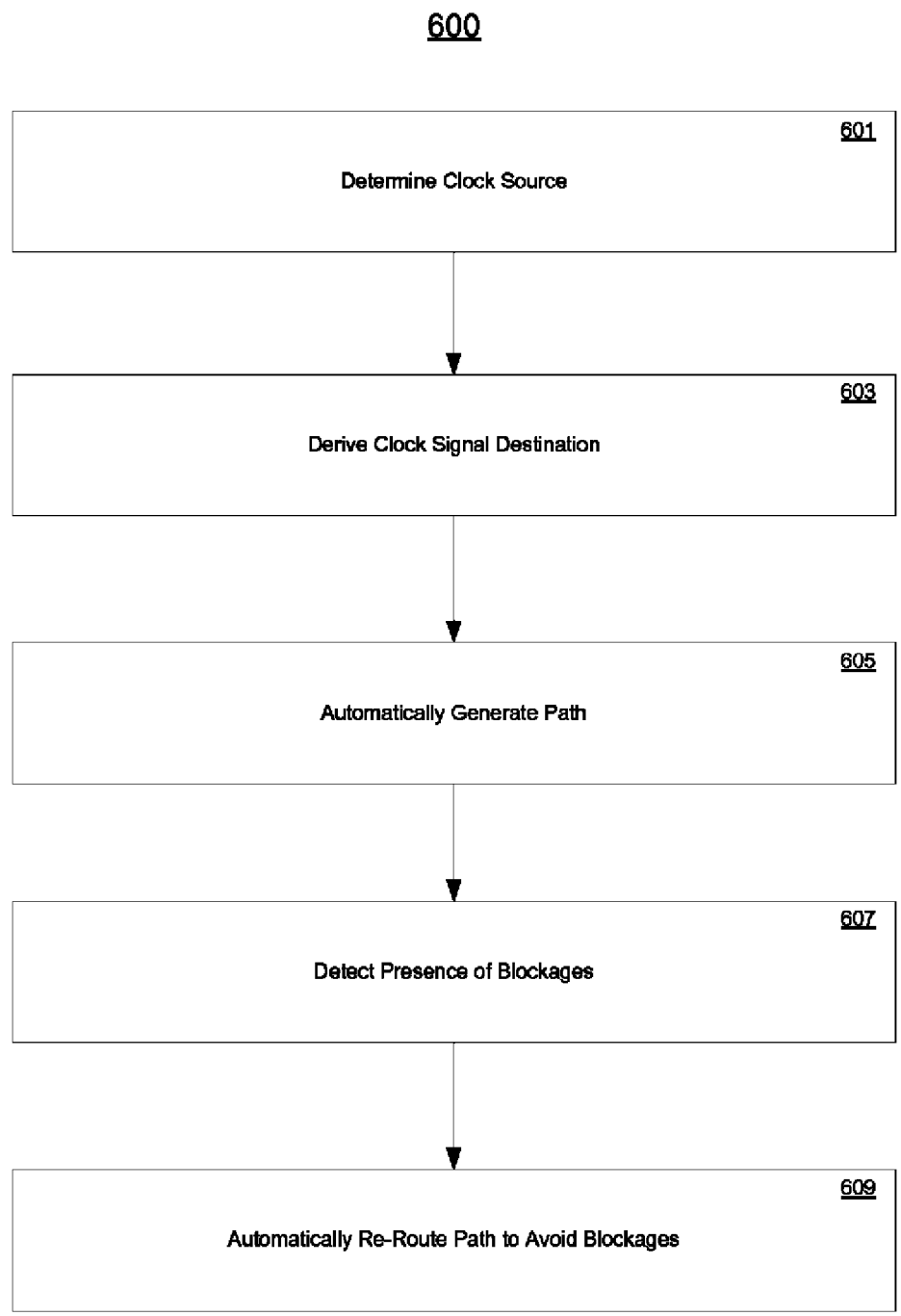
FIG. 6 depicts a flowchart of a process for automatically generating a path in an ASIC, in accordance with various embodiments of the present invention.

With reference now to FIG. 6, a flowchart 600 of a process for automatically generating a path in an ASIC is depicted, in accordance with various embodiments of the present invention. Steps 601-605 depict exemplary steps that comprise the process displayed in flowchart 600.

At steps 601, a clock source is identified as a source for generating a clock signal to be distributed to a signal destination (e.g., a logic unit) in an ASIC comprising a grid of embedded clock routing macros. In one embodiment, the clock source may be one of a plurality of clock sources in the ASIC. In some embodiments, the clock source may be identified by supplying the identification of a logic unit or other circuit that requests a clock signal. In such embodiments, the identification of the clock signal destination is received and the clock source is determined by referencing a schedule or map to derive the identification of the clock source responsible for providing a clock signal to the requesting logic unit.

At step 603, a signal destination is determined as the destination of the clock source identified at step 601. In one embodiment, the signal destination may be determined from the identification of the clock source by referencing a script or routing map and deriving the destinations of one or more clock signals originating from the clock source. The signal destination typically comprises some collection of logic, for example, a signal destination may include, but is not limited to: a partition, a logic cluster, or a logic module. In further embodiments, the clock source is pre-determined to be the nearest clock source to the signal destination.

At step 605, a path between the clock source identified at step 601 and the signal destination determined at 603 is automatically generated. In one embodiment, the path comprises a series of coupled clock routing macros in the grid of embedded clock routing macros. In some embodiments, the path generated is the best available (e.g., shortest) path, as determined by a path-determination algorithm, such as maze router, for example. The path may be generated by referencing, at each clock routing macro comprising a step in the path, a routing map or map of pre-programmed associations to determine an adjacent clock routing macro to comprise a next step in the path, and ultimately aggregating the entire series of adjacent clock routing macros traveled.

According to further embodiments, the process may also include determining the presence of one or more blockages in the ASIC chip which may impede or prevent the traversal of the blockages by the generated path at step 607. If the presence of blockages obstructing the path is detected, the blockages are opportunistically bypassed and detoured around by determining an alternate path that consists of next best available path which does not include travel over or through the blockages at step 609. According to still further embodiments, clock signal distribution paths may be pre-verified that the path is capable of being successfully navigated by a clock signal.

Accordingly, by enabling the automatic generation of clock signal paths through the use of uniformly spaced, unaffiliated clock routing macros, user-intensive manual pre-programming of clock signal routes may be avoided, and routes may be generated with uniform hop lengths to advantageously provide greater consistency and avoid sub-optimal pathing due to human error.

Although the subject matter has been described in language specific to structural features and/or processological acts, it is to be understood that the subject matter defined in the appended claims is not necessarily limited to the specific features or acts described above. Rather, the specific features and acts described above are disclosed as example forms of implementing the claims.

What is claimed is:
1. A method for designing clock resource distribution in an application specific integrated circuit (ASIC) comprising:
    defining, in an ASIC design floor plan comprising a plurality of partitions, a grid of clock routing points comprising a plurality of clock routing points;
    overlaying the grid of clock routing points over a design according to the ASIC design floor plan;

determining if a clock routing point of the grid of clock routing points is obstructed by a plurality of blockages comprised in the ASIC design floor plan;

adjusting positioning of the grid of clock routing points to accommodate the plurality of blockages comprised in the design;

pushing a plurality of clock routing macros into the plurality of partitions according to the grid of clock routing points; and automatically generating a clock signal distribution path comprising a plurality of adjacent clock routing macros of the plurality of clock routing macros between a clock source and a logic unit disposed in the plurality of partitions, wherein the defining, the overlaying, the determining, the adjusting, the pushing, and the generating are performed in an application executed by a processor of a computer system.

2. The method according to claim 1, wherein the automatically generating comprises automatically generating the shortest clock signal distribution path between the clock source and the logic unit.

3. The method according to claim 2, wherein the shortest route between the clock source and the logic unit is determined according to a maze router process.

4. The method according to claim 1, wherein the overlaying the grid of clock routing points comprises spacing the plurality of clock routing points in a substantially uniform manner across said design.

5. The method according to claim 1, wherein the pushing comprises:

assigning the plurality of clock routing macros to corresponding partitions of the plurality of partitions;

for each clock routing macro of the plurality of clock routing macros, automatically renaming an underlying routing structure of a clock routing macro according to a partition of the plurality of partitions corresponding to the clock routing macro.

6. The method according to claim 5, further comprising:

storing a clock routing map comprising assignments of the plurality of clock routing macros to corresponding partitions in a computer readable medium.

7. The method according to claim 1, further comprising:

in response to detecting an adjustment of the plurality of partitions comprised in the design, verifying a plurality of routes interconnecting the plurality of clock routing points of the grid of clock routing points can be used to distribute a clock signal.

8. A computer readable storage medium containing program instructions embodied therein which, when executed by a processor in a computer system, cause the processor to implement a method for designing clock resource distribution in an application specific integrated circuit (ASIC), the program instructions comprising:

instructions to define, in an ASIC design floor plan comprising a plurality of partitions, a grid of clock routing points;

instructions to overlay a plurality of clock routing macros according to the grid of clock routing points over a design according to the ASIC design floor plan;

instructions to determine if the plurality of clock routing macros is obstructed by a plurality of blockages comprised in the ASIC design floor plan;

instructions to adjust positioning of the plurality of clock routing macros to accommodate the plurality of blockages comprised in the design floor plan;

instructions to push the plurality of clock routing macros into the plurality of partitions according to the grid of clock routing points; and instructions to automatically generate a clock signal path comprising a plurality of adjacent clock routing macros between a clock source and a logic unit disposed in the plurality of partitions.

9. The computer readable storage medium of claim 8, wherein the plurality of clock routing macros are spaced at roughly uniform distances.

10. The computer readable storage medium of claim 8, wherein the clock signal path comprises a shortest route possible between the clock source and the logic unit.

11. The computer readable storage medium of claim 8, further comprising:

instructions to detect the presence of the plurality of blockages disposed in the clock signal path.

12. The computer readable storage medium of claim 11 further comprising:

instructions to re-route a clock signal path to avoid a plurality of blockages in response to detecting the presence of the plurality of blockages in the clock signal path.

13. The computer readable storage medium of claim 8, wherein the path is generated automatically by referencing a map of stored clock routing resource definitions to derive an ID of the logic unit.

14. The computer readable storage medium of claim 8, further comprising a plurality of edge clock routing macros comprised in the plurality of clock routing macros and disposed along the periphery of the design, wherein the edge clock routing macros are coupled to units external to the design.

* * * * *